US008826854B2

(12) United States Patent
Noguchi

(10) Patent No.: US 8,826,854 B2
(45) Date of Patent: Sep. 9, 2014

(54) DIRECT-CURRENT PLASMA CVD APPARATUS AND METHOD FOR PRODUCING DIAMOND USING THE SAME

(75) Inventor: Hitoshi Noguchi, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 12/654,796

(22) Filed: Jan. 4, 2010

(65) Prior Publication Data

US 2010/0178730 A1   Jul. 15, 2010

(30) Foreign Application Priority Data

Jan. 9, 2009   (JP) .................. 2009-003064

(51) Int. Cl.
C23C 16/00 (2006.01)
C23C 16/44 (2006.01)
C23C 16/503 (2006.01)
C23C 16/27 (2006.01)
C23C 16/458 (2006.01)

(52) U.S. Cl.
CPC ......... *C23C 16/4582* (2013.01); *C23C 16/4401* (2013.01); *C23C 16/503* (2013.01); *C23C 16/272* (2013.01)
USPC ....................................... 118/723 R; 427/569

(58) Field of Classification Search
CPC ..................... H01J 37/32027; H01J 37/32715
USPC ........... 118/715, 722, 723 R, 723 E, 723 DC; 427/249.8, 569
See application file for complete search history.

(56) References Cited

U.S. PATENT DOCUMENTS 5,382,293 A * 1/1995 Kawarada et al. ..... 118/723 DC
5,763,020 A * 6/1998 Yang .............................. 427/569

FOREIGN PATENT DOCUMENTS

| CN | 1332268 A | 1/2002 |
| JP | A-2-196096 | 8/1990 |
| JP | U-2-116734 | 9/1990 |
| JP | 10298752 A * | 11/1998 |
| JP | A-2001-156000 | 6/2001 |

OTHER PUBLICATIONS

English Machine Translation of JP 10-298752. Obtained from http://www19.ipdl.inpit.go.jp/PA1/cgi-bin/PA1INDEX on Oct. 24, 2012.*
Shintani, "Growth of highly (111)-oriented, highly coalesced diamond films on platinum (111) surface: A possibility of heteroepitaxy," *Journal of Materials Research*, vol. 11, No. 12, pp. 2955-2956, Dec. 1996, Materials Research Society.

(Continued)

*Primary Examiner* — Maureen Gramaglia
(74) *Attorney, Agent, or Firm* — Oliff PLC

(57) ABSTRACT

The present invention is a direct-current plasma CVD apparatus comprising at least a fixed electrode and a substrate stage having a top flat face and combined with an electrode for placing a substrate, in which the substrate stage top face is not located on a line extended from a center of the fixed electrode in vertical direction, and an angle formed between a line of a length R connecting a center of the substrate stage top face with the center of the fixed electrode and the line extended in vertical direction from the center of the fixed electrode is 90° or less. As a result, there is provided a direct-current plasma CVD apparatus in which a high quality vapor phase growth film, such as diamond of a large area having few defects caused by the fall of the substances produced at the fixed electrode, can be obtained.

3 Claims, 2 Drawing Sheets

(56) References Cited

OTHER PUBLICATIONS

Ohtsuka et al., "Epitaxial Growth of Diamond on Iridium," *Jpn. J. Appl. Phys.*, vol. 35, Part 2, No. 8B, pp. L1072-L1074, Aug. 15, 1996.
Maeda et al., "Fabrication of epitaxial diamond film on iridium substrate of 1 inch diameter," The 18th diamond symposium lecture summary, pp. 10-11, 2004.

Office Action dated Jun. 15, 2011 issued in Chinese Patent Application No. 200910253986.2 (with partial translation).
A Notification of Reasons for Refusal issued on May 10, 2011 in Japanese Application No. 2009-003064 (Partial Translation attached).

* cited by examiner $CH_4/H_2$    exhaust

DIRECT-CURRENT PLASMA CVD APPARATUS AND METHOD FOR PRODUCING DIAMOND USING THE SAME

BACKGROUND OF THE INVENTION

1. Field of the Invention

The present invention relates to a direct-current plasma CVD apparatus and a method for producing a diamond using the apparatus.

2. Description of the Related Art

Diamond has a wide band gap of 5.47 eV and a very high dielectric breakdown electric field intensity of 10 MV/cm. Furthermore, it has the highest thermal conductivity in materials. Therefore, if this is used for an electronic device, the device is advantageous as a high output electronic device.

Furthermore, diamond has a high drift mobility and is the most advantageous as a high speed electronic device in semiconductors in comparison of Johnson performance index.

Accordingly, diamond is said to be the ultimate semiconductor suitable for high frequency/high power electronic devices.

Therefore, a multilayer substrate in which a diamond film and the like is laminated on a substrate has attracted attention.

Now, most of the single crystal diamonds for fabrication of a diamond semiconductor are diamonds referred to as Ib type formed by a high pressure method. The Ib type diamonds contain a large amount of nitrogen impurities and can only be obtained at a size of no more than about a 5 mm square. Therefore, their utility is low.

By contrast, Chemical Vapor Deposition (CVD) method has an advantage that a diamond film of polycrystalline diamond of a large area having a diameter of about 6 inches (150 mm) can be obtained with a high purity.

However, in the CVD method, it has been conventionally difficult to perform single crystallization suitable for general electric devices. This is caused by a single crystal Si having been used as a substrate conventionally. That is, this is because Si and diamond are very different in lattice constant (mismatch between them is 52.6%) and it is very difficult to heteroepitaxially grow a diamond on a silicon substrate.

Therefore, various kinds of studies has progressed and there are reports that it is effective that Pt or Ir is formed as a ground film and then a diamond film is formed thereon by CVD method (see, for example, Y. Shintani, J. Mater. Res. 11, 2955 (1996), and K. Ohtsuka, Jpn. J. Appl. Phys. 35, L1072 (1996)).

In the current situation, the research relating to Ir has particularly progressed most. There is a method in which, first, by using a single crystal MgO as a substrate, an Ir film is heteroepitaxially grown thereon, and next by a direct-current plasma CVD method, the Ir film surface is pretreated by a bias treatment with a methane gas diluted by hydrogen, and a diamond film is grown on the Ir film. Thereby, there have been obtained diamonds having a conventional submicron size to a recent several millimeters' size. A thickness of the diamond portion is approximately several μm to 100 μm. For example, a diamond film is grown for 8 hours to obtain a thickness of about 100 μm in Maeda Shintaro and the other, the 18th diamond symposium lecture summary, pp. 10-11 (2004).

SUMMARY OF THE INVENTION

However, when a diamond is grown for more than several hours using a conventional direct-current CVD apparatus, extraneous substances are produced on a surface of a fixed electrode with anti-polarity disposed right above the substrate. When the growth continues, there are instances that the produced substances fall to a surface of the substrate during the growth. This becomes a major cause of defect.

The present invention was accomplished in order to solve the aforementioned problems, and its object is to provide a direct-current plasma CVD apparatus in which a high quality vapor phase growth film, such as diamond, can be obtained without an occurrence of the defects caused by the fall of the substances produced at the fixed electrode, and a method for producing a high quality diamond using the apparatus.

In order to accomplish the above object, the present invention provides a direct-current plasma CVD apparatus comprising at least a fixed electrode and a substrate stage having a top flat face and combined with an electrode for placing a substrate, in which the substrate stage top face is not located on a line extended from a center of the fixed electrode in vertical direction, and an angle formed between a line of a length R connecting a center of the substrate stage top face with the center of the fixed electrode and the line extended in vertical direction from the center of the fixed electrode is 90° or less.

As described above, when the top face of substrate stage is not located on the line extended from the fixed electrode in vertical direction, and the angle formed between the line of the length R connecting the center of the substrate stage top face with the center of the fixed electrode and the line extended in vertical direction from the center of the fixed electrode is 90° or less, it is possible to prevent the adherent substance produced on the fixed electrode by plasma CVD from falling on the substrate stage and thereby, an occurrence of the defects caused by the falling substance can be suppressed. Therefore, a high quality vapor phase growth film having few defects can be produced. Furthermore, disappearance of a discharge between the fixed electrode and the substrate stage can be suppressed.

Here, it is preferable that the substrate stage top face is disposed tangent to a circle with a radius R of which a center is at the center of the fixed electrode.

In this way, when the substrate stage top face is disposed tangent to the circle with a radius R of which the center is at the center of the fixed electrode, a high quality vapor phase growth film can be more easily obtained since the vapor phase growth film can be efficiently grown on the substrate stage.

Moreover, it is preferable that the top face of the substrate stage is circular and has a radius of r, and the angle $\theta(°)$ formed between the line connecting the center of the substrate stage top face with the center of the fixed electrode and the line extended in vertical direction from the center of the fixed electrode satisfies the following relation.

$$\cos^{-1}\{(R^2-2r^2)/R^2\} \leq \theta \leq 90°$$

In this way, when the angle θ formed between the line connecting the center of the substrate stage top face with the center of the fixed electrode and the line extended from the center of the fixed electrode in vertical direction from the center of the fixed electrode satisfies the relation described above, it is possible more surely prevent the produced substances adhering to the fixed electrode in CVD from falling on the substrate stage, thus the substrate and the vapor phase growth film; therefore an occurrence of the defects caused by the produced substances in the vapor phase growth film can be further suppressed. Therefore, the direct-current plasma CVD apparatus becomes one which can more easily produce a high quality vapor phase growth film at high yield.

Moreover, it is preferable that the fixed electrode and the substrate stage are made of any one of tantalum (Ta), molybdenum (Mo), tungsten (W).

In this way, when the fixed electrode and the substrate stage are made of any one of Ta, Mo, W, which have a high melting point, for example, possibility that the fixed electrode and the substrate stage melt by heat to deform or to disappear can be sufficiently reduced in a vapor phase reaction. Therefore, a cost needed for maintenance of the apparatus can be reduced.

Moreover, it is preferable that the fixed electrode is a cathode and the substrate stage is an anode.

In this way, when the fixed electrode is a cathode and the substrate stage is an anode, for example, the direct-current plasma CVD apparatus becomes one which is suitable for producing a diamond ant the like.

Furthermore, the present invention provides a method for producing a diamond in which at least a mixed gas consisted of a carbon contained gas and a hydrogen gas is used as raw material, a diamond is grown on the substrate by a vapor phase reaction using a direct-current plasma CVD apparatus described in the present specification.

As described above, since the direct-current plasma CVD apparatus of the present invention can reduce possibility that the defects occur in the vapor phase growth film, a high quality diamond of a large area having few defects can be efficiently obtained by producing a diamond using such direct-current plasma CVD apparatus.

As explained above, the present invention can provide a direct-current plasma CVD apparatus in which a high quality vapor phase growth film, such as diamond, can be efficiently produced without the fall of the substances produced at the fixed electrode on the surface of the substrate in CVD and thereby without an occurrence of the defects caused by the fall of the produced substances.

DETAILED DESCRIPTION OF THE PREFERRED EMBODIMENTS

Hereinafter, embodiments of the present invention will be explained. However, the present invention is not limited by these explanations.

As described above, in the case that a vapor phase growth film, such as diamond and the like, is grown using a conventional direct-current plasma CVD apparatus, if CVD is performed for a long time, the produced substances on the fixed electrode located right above the substrate are grown and finally fall to the substrate surface located below the fixed electrode facing each other.

Therefore, there is a problem that it is difficult to obtain a thick diamond having no defect.

Accordingly, the present inventor diligently studied for solving such a problem.

As a result, the present inventor found that when the substrate stage combined with an electrode for placing the substrate is not located just below the fixed electrode facing toward the substrate stage and an angle formed between the line connected the center of the substrate stage with the center of the fixed electrode and the line extended from the center of the fixed electrode in vertical direction is 90° or less, the fall of the substances produced at the fixed electrode to the substrate surface during growth can be prevented, consequently, a high quality vapor phase growth film having no defect can be obtained and disappearance of a discharge between the fixed electrode and the substrate stage can be suppressed, thereby bringing the present invention to completion.

The present invention will be explained in detail hereinafter with reference to the drawings, but the present invention is not restricted thereto.

The direct-current plasma CVD apparatus of the present invention includes at least a chamber, a fixed electrode and a substrate stage having a top flat face and combined with an electrode for placing a substrate.

Moreover, the substrate stage top face is not located on a line extended from the fixed electrode in vertical direction and is located in such a manner that an angle θ formed between a line of a length R connecting a center of the substrate stage top face with a center of the fixed electrode and the line extended from a center of the fixed electrode in vertical direction satisfies the relation of θ≤90°.

Figure 1:
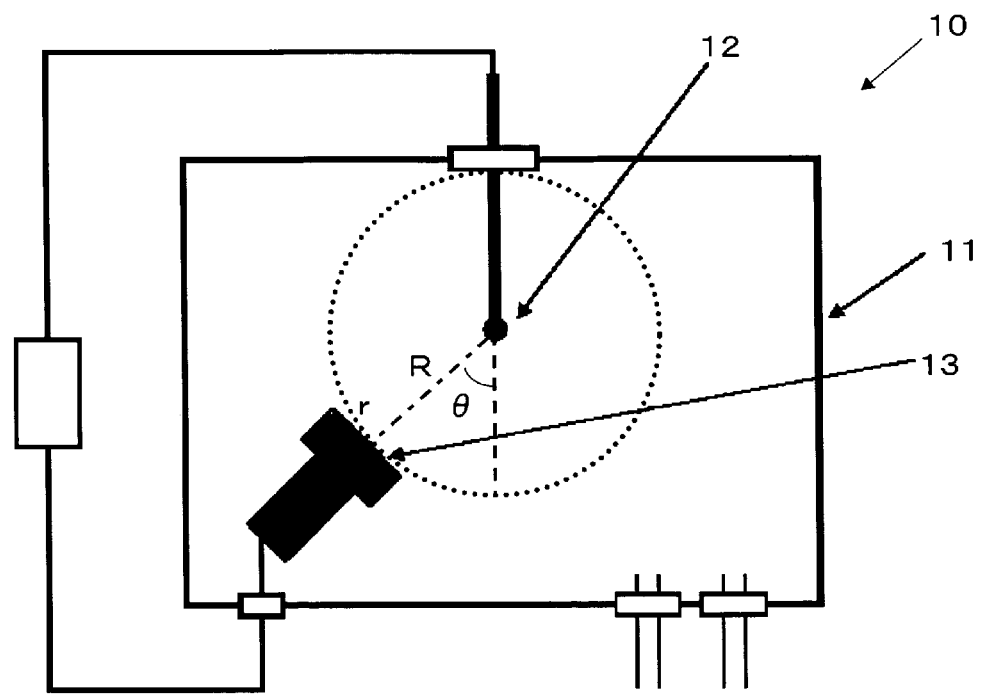
FIG. 1 is a schematic view showing an example of the direct-current plasma CVD apparatus of the present invention.

As shown in FIG. 1, the direct-current plasma CVD apparatus 10 may include at least the chamber 11, the fixed electrode 12 and the substrate stage 13 that is disposed tangent to a circle with a radius R of which a center is at the center of the fixed electrode 12 and that is combined with an electrode for placing the substrate with a radius r.

At this time, the substrate stage 13 may be disposed in such a manner that the angle θ formed between the line connected the center of the substrate stage 13 with the center of the fixed electrode 12 (alternate long and short line) and the line extended from the center of the fixed electrode 12 in vertical direction (broken line) satisfies the following relation.

$$\cos^{-1}\{(R^2-2r^2)/R^2\} \le \theta \le 90°$$

In this way, the substrate stage is not located just below the fixed electrode facing toward the substrate stage. This is in order to prevent the produced substances adhering to the fixed electrode from falling to the substrate surface on the substrate stage.

Moreover, if θ exceeds 90°, it is possible that a discharge occurs between a portion of the fixed electrode that is not a tip and the substrate stage. Therefore, the angle θ is set to be 90° or less.

Furthermore, when the top face of the substrate stage 13 is circular and has a radius of r and θ is less than $\cos^{-1}\{(R^2-2r^2)/R^2\}$, it is possible that the substances produced at the fixed electrode fall to the substrate stage. Therefore, it is preferable that θ is $\cos^{-1}\{(R^2-2r^2)/R^2\}$ or more.

As described above, θ does not exceed 90°.

As a specific example, in the case of R=40 mm and r=15 mm, the result of calculation is $\cos^{-1}\{(R^2-2r^2)/R^2\} \approx 44.0°$. That is, the optimum position of the substrate stage is in range of 44°≤θ≤90°.

In this way, the substrate stage is located to avoid the vertical line from the fixed electrode facing toward the substrate stage and the angle θ formed between the line connected the center of the substrate stage with the center of the fixed electrode and the line extended from the center of the fixed electrode in vertical direction is 90° or less. And thereby, it can be prevented the produced substances adhering to the fixed electrode in CVD from falling on the substrate stage, thus the substrate and the vapor phase growth film. An occurrence of the defects caused by the falling substances can be prevented. Thus, a high quality vapor phase growth film having few defects can be obtained at high yield.

Moreover, for example, when a diamond is produced as a vapor phase growth film, a diamond of a large area having few defects can be efficiently obtained. Use of such diamond enables manufacturing an excellent high frequency/high power electronic devices at high yield.

Here, in the case that a plurality of the fixed electrode are placed, the center of the fixed electrode described above can be a center of a figure depicted by connecting the tip portion of a plurality of the fixed electrodes.

If the fixed electrode is a flat plate type, a direction of the fixed electrodes correspond with arrangement of the substrate stage in such a manner that a positional relationship between each electrode surface is kept to be parallel at any time.

Moreover, the fixed electrode 12 and the substrate stage 13 can be made of a high melting point metal, such as Ta, Mo and W, in order to resist high heat during a discharge. In particular, when the electrode having complicated shapes is needed, using Ta or Mo is preferable for processing.

In this way, when the fixed electrode and the substrate stage are made of any one of Ta, Mo, W, which have a high melting point, risk that the fixed electrode and the substrate stage deform or melt by heat generated during the vapor phase growth can be sufficiently reduced. Therefore, a cost needed for maintenance of the fixed electrode and the substrate stage can be reduced, and thereby a running cost of the apparatus can be reduced.

Moreover, the fixed electrode may be a cathode and the substrate stage may be an anode.

In this way, when the fixed electrode is a cathode and the substrate stage is an anode, for example, the direct-current plasma CVD apparatus can be the apparatus suitable for producing a diamond ant the like.

Moreover, when θ is set to be large, the substrate stage slopes and thereby the substrate to be placed moves. In this case, the movement may be managed by roughening the surface (substrate placing surface) of the substrate stage 13, forming a shallow groove (spot facing) on the surface as slip stopper or fixing the edge of the substrate using a small claw. In addition, of course a back surface of the substrate may be held by vacuum suction.

It addition, it is desirable that the fixed electrode 12 is hanged from an upper portion of the chamber 11 to be disposed and that the substrate stage 13 is inserted from a lower portion of the chamber 11 to be disposed.

This is because it is possible that a glowing vapor phase growth film falls by gravity if the substrate stage is disposed above the chamber. To prevent this and to hold the vapor phase growth film from below, it is desirable that the substrate stage is inserted from a lower portion of the chamber to be disposed. In respond to this, to prevent from discharging except between the tip of the fixed electrode and the substrate stage combined with an electrode, it is desirable that the fixed electrode is inserted from an upper portion of the chamber to be disposed.

Figure 2:
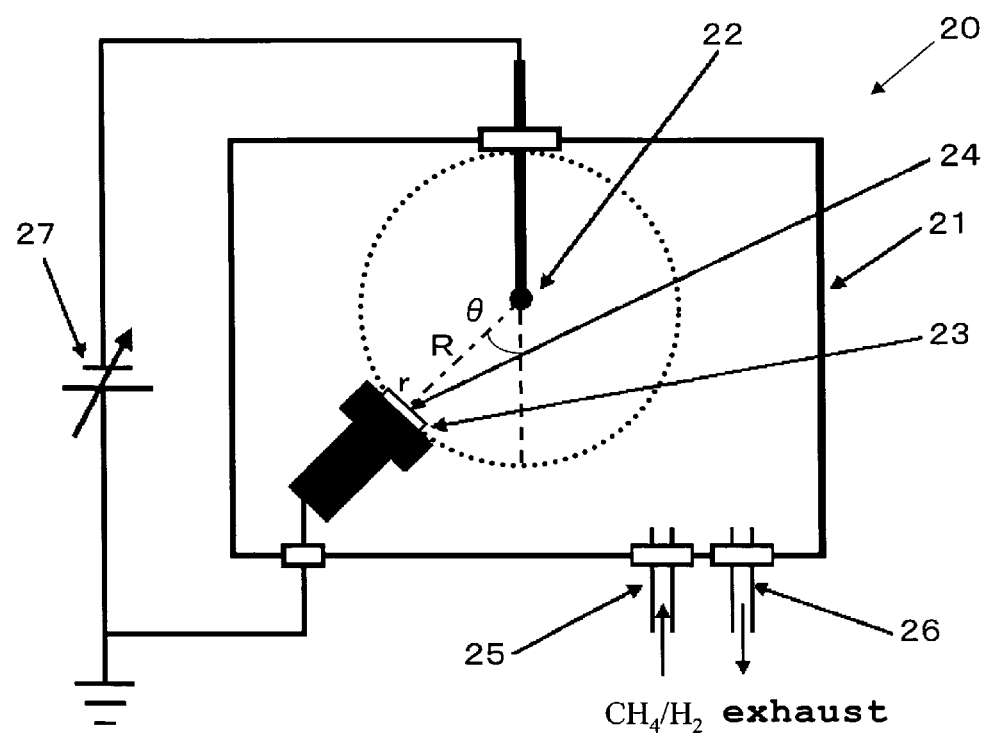
FIG. 2 is a schematic view showing another example of the direct-current plasma CVD apparatus of the present invention.

Next, a method for producing a diamond using the direct-current plasma CVD apparatus of the present invention described above will be explained hereinafter with reference to FIG. 2, but the present invention is not of course restricted thereto. FIG. 2 is a schematic view showing another example of the direct-current plasma CVD apparatus of the present invention.

First, the direct-current plasma CVD apparatus 20 shown in FIG. 2 is prepared, and the substrate 24 on which a diamond grows by a vapor phase reaction is placed on the substrate stage 23 combined with an electrode and disposed in the chamber 21. At this time, the substrate stage 23 is disposed, for example, in such a manner that the angle θ formed between the line connected the center of the substrate stage 23 with the center of the fixed electrode 22 (alternate long and short line) and the line extended from the center of the fixed electrode 22 in vertical direction (broken line) satisfies the relation of $\cos^{-1}\{(R^2-2r^2)/R^2\} \leq \theta \leq 90°$. The present invention is not of course restricted thereto at this time. The substrate stage may be disposed in such a manner that the substrate stage is not disposed on the line extended from the fixed electrode in vertical direction and the angle formed between the line connected the center of the substrate stage with the center of the fixed electrode and the line extended in vertical direction is 90° or less. Moreover, the substrate stage may be disposed so as to be in contact with a circle with a radius R of which a center is a position of the fixed electrode.

Moreover, it is desirable that the fixed electrode 22 is a cathode and the substrate stage 23 on which the substrate 24 is placed is an anode.

Then, inside of the chamber 21 is exhausted with a rotary pump and the like to reduce its pressure to $10^{-3}$ Torr (about $1.3\times10^{-1}$ Pa) or less.

Next, at least a mixed gas consisted of a carbon contained gas and a hydrogen gas, such as a hydrogen-diluted methane gas, is introduced from a gas inlet pipe 25 to the chamber 21.

Next, after a valve of the gas outlet pipe 26 is adjusted to make the pressure in the chamber 21 a desired pressure, DC voltage is applied to both the electrodes from DV power source 27 to generate plasma in the chamber 21, so that a diamond film is grown on the substrate 24.

According to the method for producing a diamond, an occurrence of the defects in the diamond caused by the produced substances adhering to the fixed electrode can be prevented. Therefore, a high quality diamond of a large area having few defects can be obtained at high yield.

EXAMPLES

Hereinafter, the present invention will be more specially explained by showing Example and Comparative Examples. However, the present invention is not limited to these.

Example

There was prepared a direct-current plasma CVD apparatus shown in FIG. 2. The fixed electrode is made of Ta to be a cathode and the substrate stage is made of Mo to be an anode. Furthermore, there was prepared Ir/MgO substrate having a diameter of 10 mm and a thickness of 0.5 mm.

Moreover, a distance R of the electrodes was made to be 40 mm and a radius r of the substrate stage was made to be 15 mm. Thus, a result of the formula of $\cos^{-1}\{(R^2-2r^2)/R^2\}$ is as follows.

$$\cos^{-1}\{(R^2-2r^2)/R^2\} = \cos^{-1}\{(40^2-2\times15^2)/40^2\}$$
$$= \cos^{-1}(0.719)$$
$$\approx 44$$

And, the relation was as follows.

$$44° \leq \theta \leq 90°$$

Therefore, the angle θ formed between the line connected the center of the substrate stage with the center of the fixed electrode and the line extended from the center of the fixed electrode in vertical direction was set to be 50°.

Moreover, a CVD condition was that a concentration of the hydrogen-diluted methane gas was 2.0 vol. %, a pressure of the chamber was 10 kPa, discharge voltage was 800 V (the fixed electrode was a cathode, the substrate stage was an anode and earth connection) and growth time was 10 hours.

As a result of observation of a vapor phase growth, the fall of the produced substances adhering to the tip of the fixed electrode in CVD was not observed.

After finishing CVD, the substrate was taken out and evaluated. As a result, the diamond having an average thickness of 80 μm was formed without the defects on the entire surface of the substrate having a diameter of 10 mm.

Comparative Example 1

Except for setting θ at 0°, that is, the center of the substrate stage was located on the line extended from the center of the fixed electrode in vertical direction, a diamond was produced in a condition similar to that in Example.

As a result of observation of a vapor phase growth, the fall of the produced substances adhering to the tip of the fixed electrode in CVD was observed.

Moreover, after finishing the vapor phase growth, the substrate and the diamond was took out from the chamber and an existence of the defects was evaluated. As a result, the defects caused by the falling substances were observed in the diamond.

Comparative Example 2

Except for setting θ at 100° and holding the substrate on the substrate stage by vacuum suction, a diamond was produced in a condition similar to that in Example and Comparative Example 1.

However, when CVD was started, a discharge occurred between a portion that was not the tip of the fixed electrode and the substrate stage, such as a portion where the fixed electrode was held. Therefore the diamond was not grown by the vapor phase reaction.

It is to be noted that the present invention is not restricted to the foregoing embodiment. The embodiment is just an exemplification, and any examples that have substantially the same feature and demonstrate the same functions and effects as those in the technical concept described in claims of the present invention are included in the technical scope of the present invention.

What is claimed is:

1. A direct-current plasma CVD apparatus for growing a diamond, comprising:
    a fixed electrode having a rounded portion, and
    a substrate stage having a top flat face and combined with an electrode for placing a substrate,
    wherein,
    the substrate stage top face is located to avoid a vertical line from a center of the fixed electrode so that the substrate during growth is located to avoid the vertical line from the center of the fixed electrode,
    an angle formed between a line of a length R connecting a center of the substrate stage top face with the center of the fixed electrode and the line extended in vertical direction from the center of the fixed electrode is 90° or less,
    the substrate stage top face is disposed at a position that is tangent to a circle having a radius R, a center of the circle being located at the center of the fixed electrode, and
    the top face of the substrate stage is circular and has a radius of r, and the angle θ(°) formed between the line connecting the center of the substrate stage top face with the center of the fixed electrode and the line extended in vertical direction from the center of the fixed electrode satisfies the following relation:

$\cos^{-1}\{(R^2-2r^2)/R^2\} \leq \theta \leq 90°$, the fixed electrode and the substrate stage are made of any one of tantalum (Ta), molybdenum (Mo), and tungsten (W).

2. The direct-current plasma CVD apparatus according to claim 1, wherein the fixed electrode is a cathode and the substrate stage is an anode.

3. A method for producing a diamond wherein at least a mixed gas consisted of a carbon contained gas and a hydrogen gas is used as raw material, a diamond is grown on the substrate by a vapor phase reaction using a direct-current plasma CVD apparatus according to claim 1.

* * * * *